(12) United States Patent
Zhovnirovsky et al.

(10) Patent No.: US 8,437,085 B1
(45) Date of Patent: May 7, 2013

(54) OPTICAL ELEMENT ASSEMBLY WITH INTEGRALLY FORMED MICROLENS

(75) Inventors: Igor Zhovnirovsky, Newton, MA (US); Subhash Roy, Lexington, MA (US)

(73) Assignees: Applied Micro Circuits Corporation, San Diego, CA (US); Volex PLC, London (GB)

( * ) Notice: Subject to any disclaimer, the term of this patent is extended or adjusted under 35 U.S.C. 154(b) by 76 days.

(21) Appl. No.: 13/243,439

(22) Filed: Sep. 23, 2011

(51) Int. Cl.
*G02B 27/10* (2006.01)
(52) U.S. Cl.
USPC .......................................... 359/619; 359/620
(58) Field of Classification Search ........... 359/619–621
See application file for complete search history.

(56) References Cited

U.S. PATENT DOCUMENTS

| | | | |
|---|---|---|---|
| 7,223,619 B2 | 5/2007 | Wang et al. | |
| 2010/0328779 A1* | 12/2010 | Llombart Juan et al. | 359/619 |

OTHER PUBLICATIONS

Gimkiewicz et al., "Wafer-scale replication and testing of micro-optical components for VCSELs", Proc. of SPIE vol. 5453, pp. 13-26, (2004).

* cited by examiner

*Primary Examiner* — William Choi
(74) *Attorney, Agent, or Firm* — Woodcock Washburn LLP

(57) ABSTRACT

An optical element assembly with integrally formed microlens is presented. A wafer is provided with a plurality of adjacent IC optical elements, each optical element having an optical transmission port in a wafer top surface. A microlens array is attached to the wafer top surface, so that each microlens in the array overlies a corresponding optical element optical transmission port. Then, a wafer of optical elements with attached microlenses is formed, where each microlens has a first lens surface adhering directly to a corresponding optical transmission port. Subsequent to forming the wafer of optical elements with attached microlenses, the wafer is diced forming a plurality of optical element assemblies. Each optical element assembly includes an optical element integrally formed with an attached microlens.

23 Claims, 6 Drawing Sheets

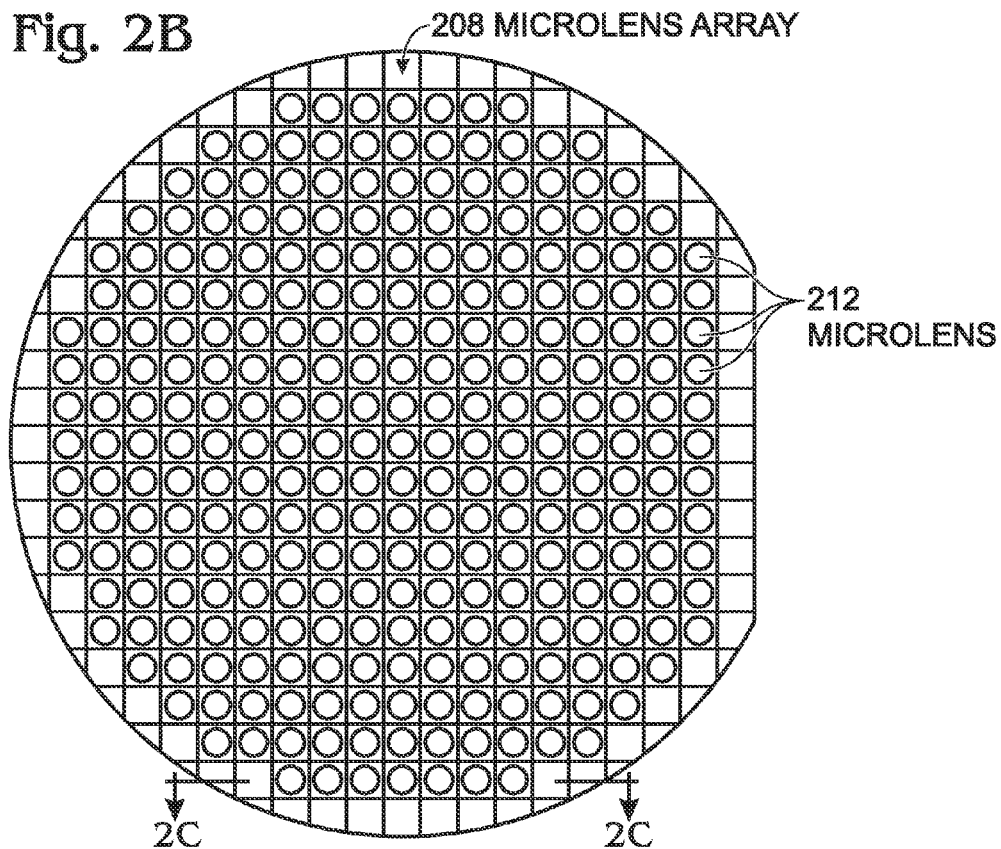
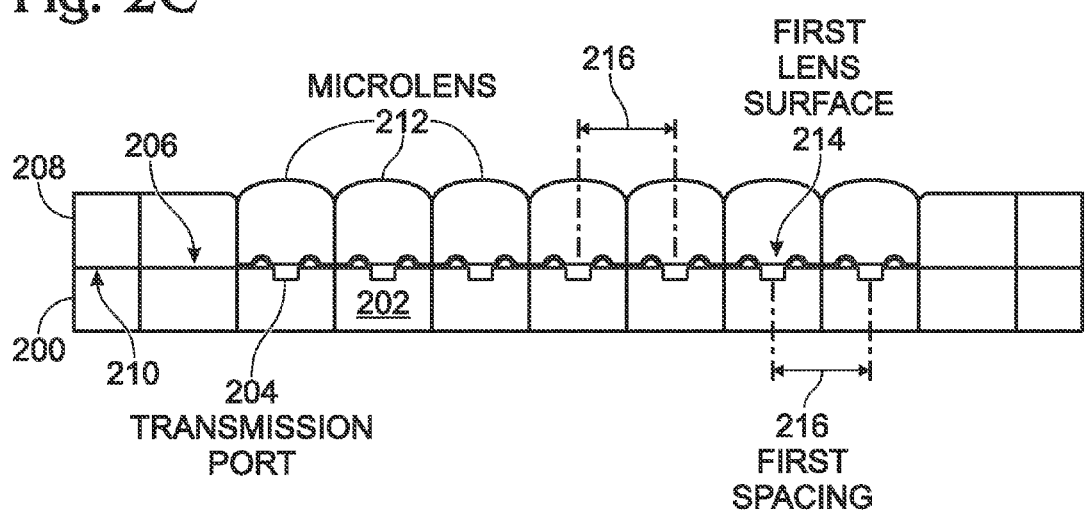

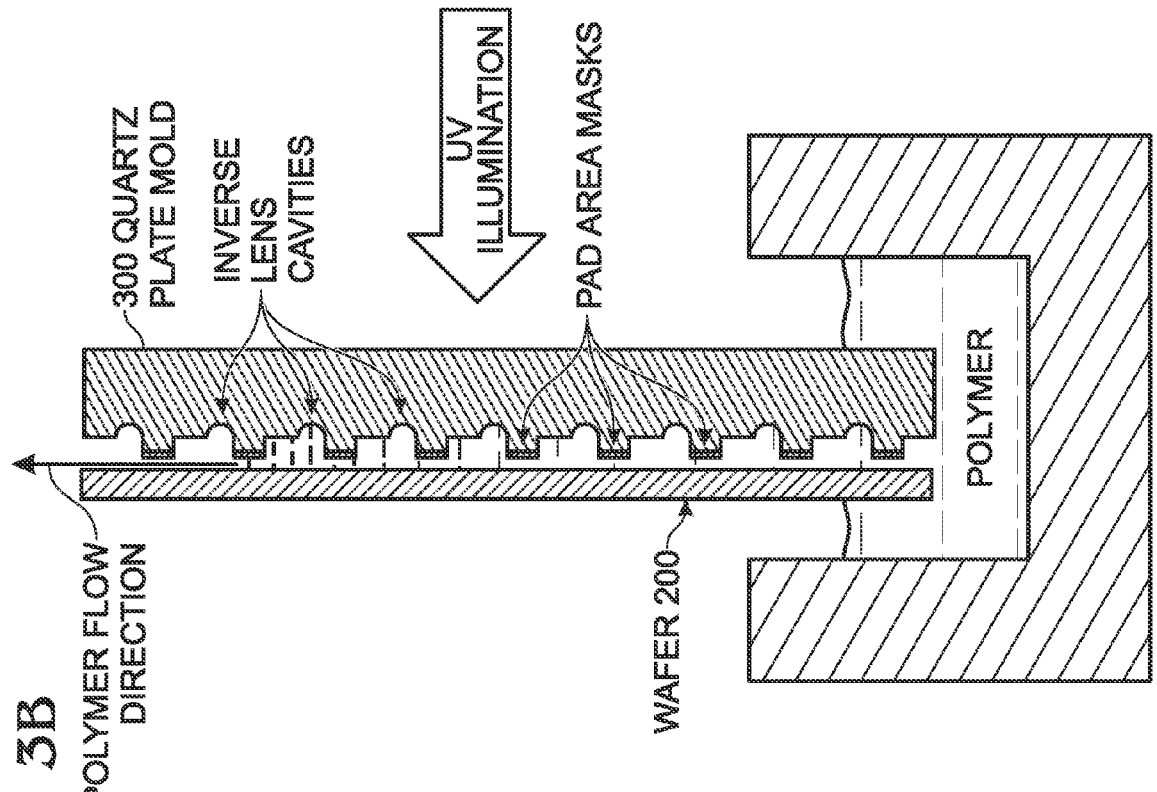
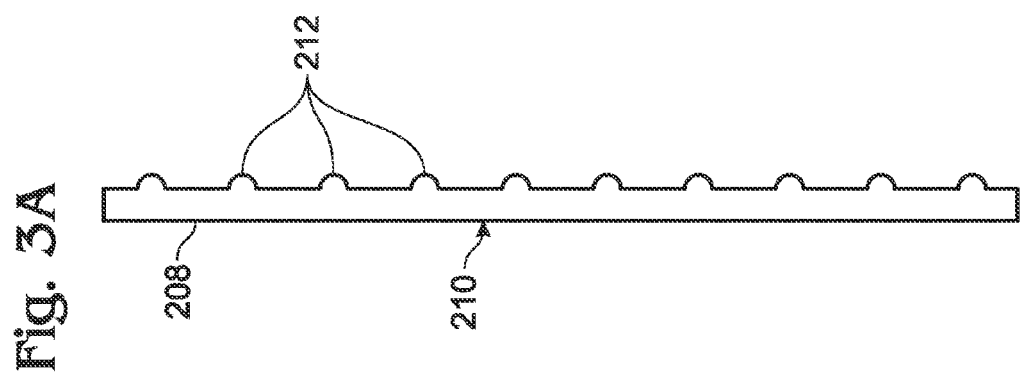

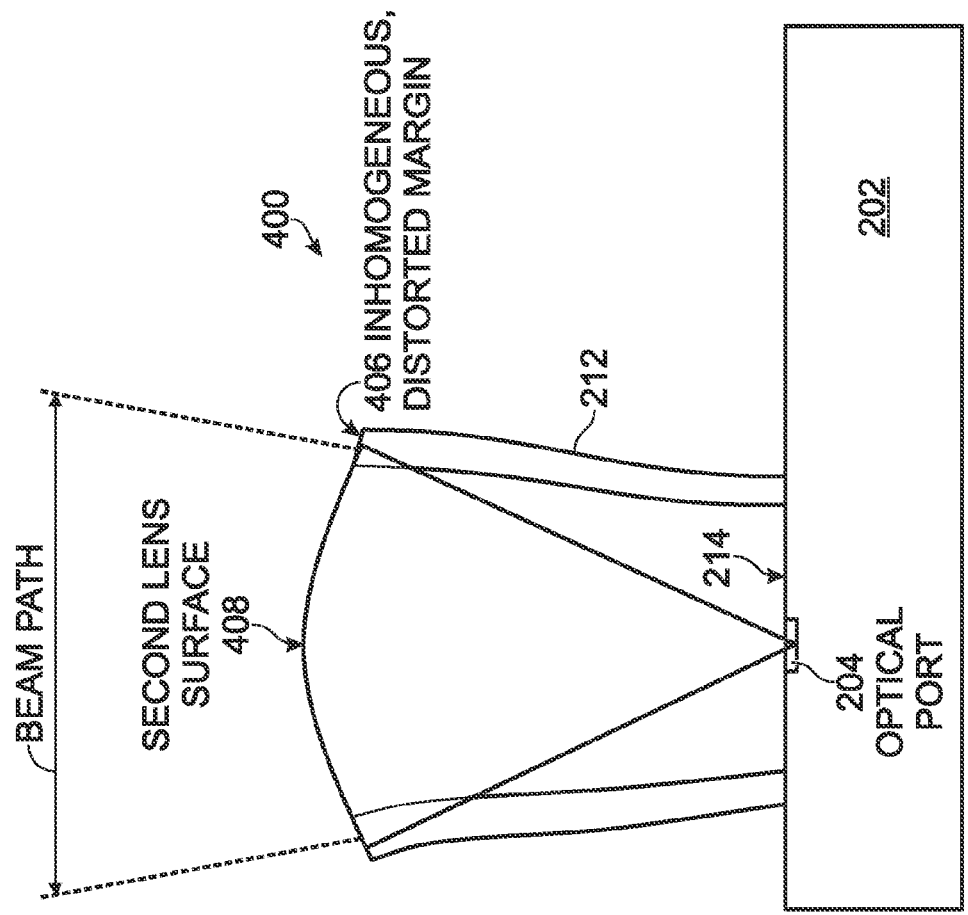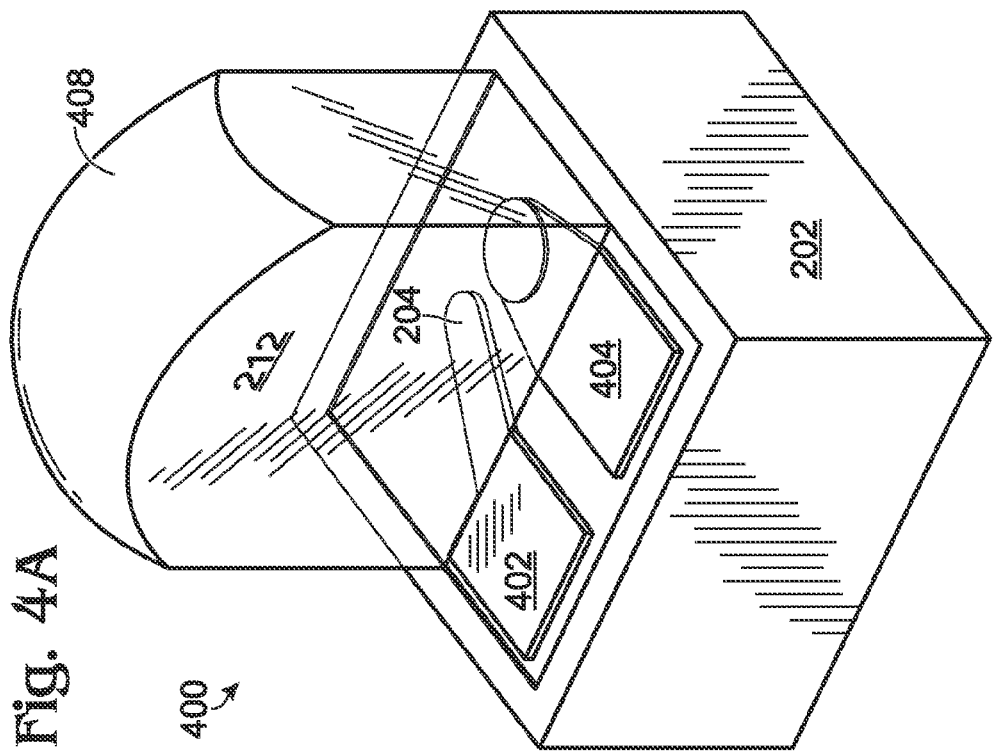

OPTICAL ELEMENT ASSEMBLY WITH INTEGRALLY FORMED MICROLENS

BACKGROUND OF THE INVENTION

1. Field of the Invention

This invention generally relates to optical/electrical devices and, more particularly, to an optical/electrical device with a pre-attached lens to expand the effective aperture and optical beam width.

2. Description of the Related Art

As noted in Wikipedia, the vertical-cavity surface-emitting laser (VCSEL) is a type of semiconductor laser diode with laser beam emissions perpendicular from the top surface, contrary to conventional edge-emitting semiconductor lasers which emit from surfaces formed by cleaving the individual chip out of a wafer. The VCSEL has many potential advantages over the edge-emitting lasers. Its design allows chips or dies to be manufactured and tested on a single wafer. Large arrays of devices can be created exploiting methods such as flip-chip optical interconnects and optical neural network applications to become possible. In the telecommunications industry, the VCSEL's uniform, single mode beam profile is desirable for coupling into optical fibers. However, with these advantages come a number of problems particularly in the fabrication and operation at high powers.

There are many designs of VCSELs, however, they all have certain aspects in common. The cavity length of VCSELs is very short typically 1-3 wavelengths of the emitted light. As a result, in a single pass of the cavity, a photon has a small chance of a triggering a stimulated emission event at low carrier densities. Therefore, VCSELs require highly reflective mirrors to be efficient. In edge-emitting lasers, the reflectivity of the facets is about 30%. For VCSELs, the reflectivity required for low threshold currents is greater than 99.9%. Such a high reflectivity cannot be achieved with the use of metallic mirrors. VCSELs make use Distributed Bragg Reflectors (DBRs). These are formed by laying down alternating layers of semiconductor or dielectric materials with a difference in refractive index. At the dispersion minima for optical fibers, semiconductor materials used for DBRs have a small difference in refractive index, therefore, many periods are required. Since the DBR layers also carry the current in the device, more layers increase the resistance of the device. Therefore, dissipation of heat and growth can become a problem.

FIG. 1 is a partial cross-sectional view of a metallic reflector VCSEL (prior art). Today, most VCSEL devices employ quantum wells within the cavity. By depositing a thin layer of semiconductor with a slightly smaller band gap, one cannot only define a region for recombination to occur, one can control the optical properties of the device. Discrete energy levels are formed in the conduction and valence bands. The power obtained from a single quantum well is low. Multiple quantum wells may be grown within the cavity to increase power obtained.

The reduced cavity length in VCSELs and the addition of quantum wells significantly reduces the probability of stimulated emission in a single pass of the cavity. The light within the cavity must be reflected back into the cavity many more times than with a Fabry Perot laser. The average time the photons spend within the cavity is known as the photon lifetime. The reflectivity of the mirrors must be very high to increase the photon lifetime and thus the time of interaction with the excited electron states.

VCSELs for wavelengths from 650 nm to 1300 nm are typically based on gallium arsenide (GaAs) wafers with DBRs formed from GaAs and aluminum gallium arsenide ($Al_xGa_{(1-x)}As$). Longer wavelength devices, from 1300 nm to 2000 nm, have been demonstrated with at least the active region made of indium phosphide.

A photodiode is a type of photodetector capable of converting light into either current or voltage, depending upon the mode of operation. The conventional solar cell used to generate electric solar power is a large area photodiode. Photodiodes are similar to regular semiconductor diodes except that they may be either exposed (to detect vacuum UV or X-rays), or packaged with a window or optical fiber connection to allow light to reach the sensitive part of the device. Many diodes designed for use specifically as a photodiode use a PIN junction rather than the typical p-n junction to increase the speed of response. A photodiode is designed to operate in reverse bias.

When a photon of sufficient energy strikes the diode, it excites an electron, thereby creating a positively charged electron hole. This mechanism is also known as the photoelectric effect. If the absorption occurs in the junction's depletion region, or one diffusion length away from it, these carriers are swept from the junction by the built-in field of the depletion region. Thus holes move toward the anode, and electrons toward the cathode, and a photocurrent is produced. This photocurrent is the sum of both the dark current (without light) and the light current, so the dark current must be minimized to enhance the sensitivity of the device.

One problem with the use is laser diode devices made using convention IC fabrication procedures is the "quality" of the optical beam created. Ideally, the beams should be confined to a collimated path with a narrow beam diameter. In practice, the beam may be dispersed in a pattern defined by a cone angle. To aid in beam collimation, a lens may be used in conjunction with a laser diode. Likewise, to compensate for the misalignment of a collimated beam, or to aid in the collection of a dispersed beam, a lens may be used in conjunction with a photodiode to gather a greater intensity of light.

Unfortunately, although photodiodes and VCSELs can be fabricated on wafers using convention IC fabrication processes, it has proved difficult to fabricate these devices with pre-attached lenses. As a result, the lens must be integrated with the VCSEL or photodiode as a separate component at a higher level, after the wafer has been diced and the individual photodiode or VCSEL devices are assembled into an end product device. Integration at this level typically requires that the placement of the lens be adjusted with respect to the photodiodes or VCSELs. This low scalability alignment procedure may involve the use of precision mechanical elements—slowing production and adding to costs.

It would be advantageous if lens could be integrated with laser diodes and photodiodes at the wafer level.

SUMMARY OF THE INVENTION

Directly attaching a lens to an optical element such as a laser diode or photodiode early in production permits a more precise lens/optical element alignment, with a subsequently better quality of collimated beam. The resulting lens/optical element assembly eliminates multiple alignment steps during optical device assembly, resulting in a less expensive, more accurate device with much larger production scalability.

Accordingly, a method is provided for the fabrication of an optical element assembly with integrally formed microlens. A wafer is provided with a plurality of adjacent IC optical elements, each optical element having an optical transmission port in a wafer top surface. A microlens array is attached to the wafer top surface, so that each microlens in the array overlies a corresponding optical element optical transmission port. Then, a wafer of optical elements with attached microlenses is formed, where each microlens has a first lens surface adhering directly to a corresponding optical transmission port. Subsequent to forming the wafer of optical elements with attached microlenses, the wafer is diced forming a plurality of optical element assemblies. Each optical element assembly includes an optical element integrally formed with an attached microlens.

Additional details of the above-described method and an optical element with integrally formed microlens are provided below.

BRIEF DESCRIPTION OF THE DRAWINGS

FIGS. 2A and 2B are plan views, and FIG. 2C is a partial cross-section view of an optical element with integrally formed microlens.

FIGS. 3A and 3B are partial cross-sectional views depicting two different types of microlens arrays.

FIGS. 4A and 4B are, respectively, perspective and partial cross-sectional views of an integral lens/optical element assembly.

DETAILED DESCRIPTION

Figure 1:
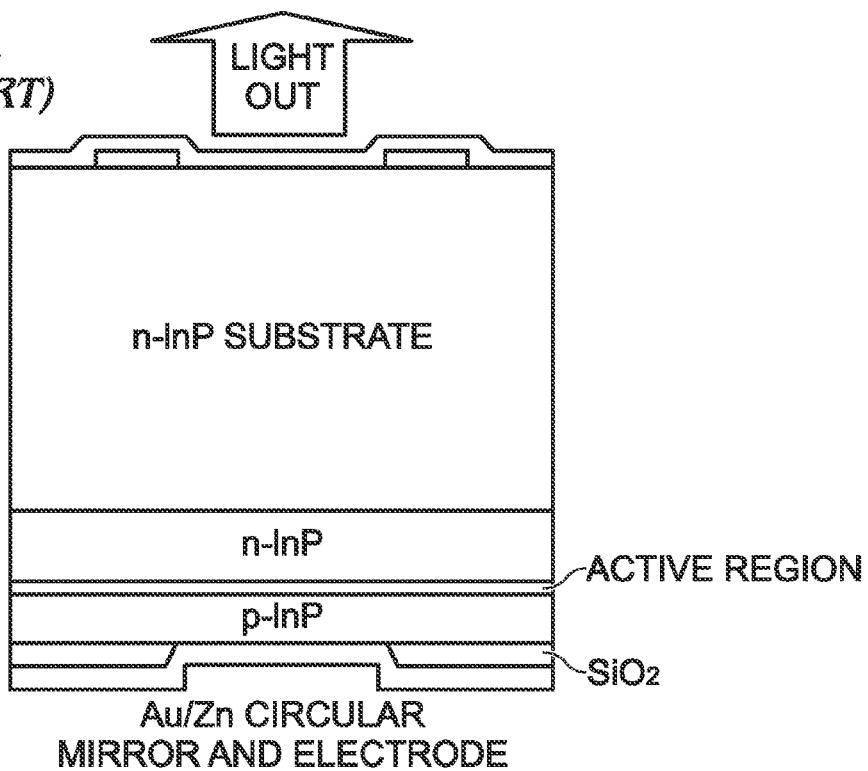
FIG. 1 is a partial cross-sectional view of a metallic reflector VCSEL (prior art).
Figure 2A:
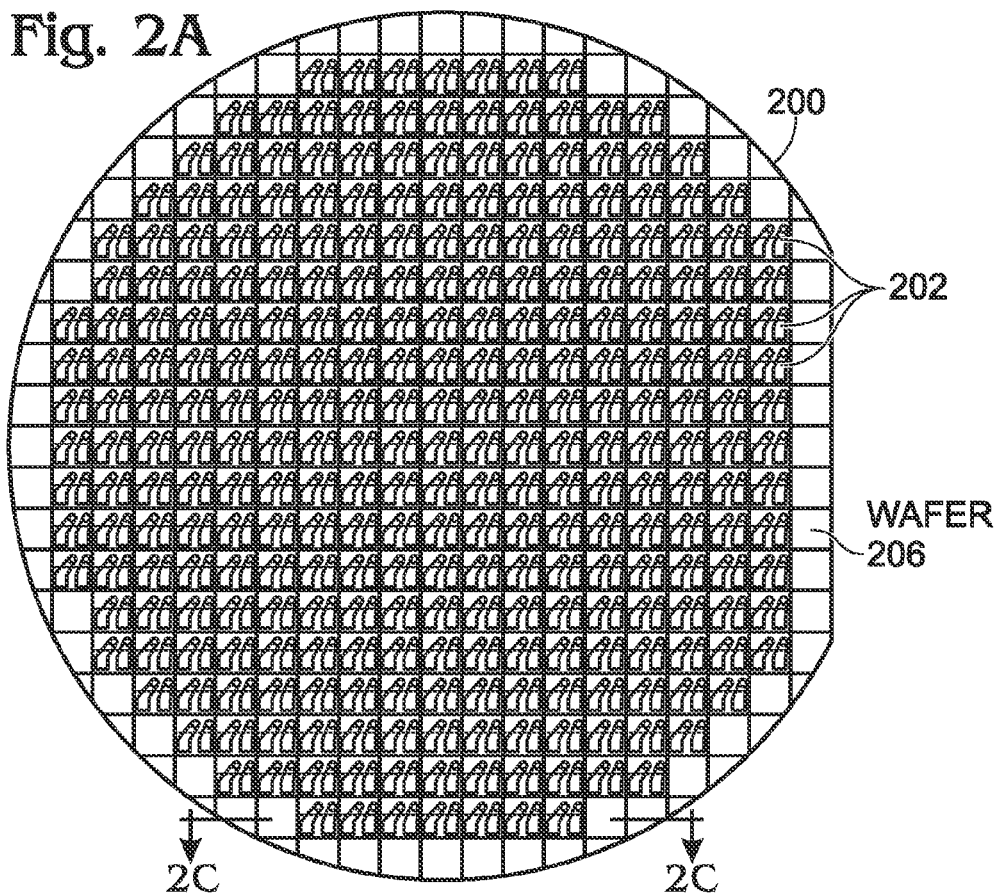

FIGS. 2A and 2B are plan views, and FIG. 2C is a partial cross-section view of an optical element with integrally formed microlens. FIG. 2A depicts a plan view of a wafer 200 with a plurality of adjacent IC optical elements (i.e. optical element dice) 202. Each optical element has an optical transmission port 204 in a wafer top surface 206. The optical element can be either a photodiode or laser diode. A microlens array 208 with a bottom surface 210 overlies the wafer top surface 206. Each microlens 212 overlies a corresponding optical element optical transmission port, with a first lens surface 214 adhering directly to a corresponding optical transmission port 204. In one aspect, the first lens surface 214 is adhered to the optical transmission port 204 without a (air) gap. The microlenses are considered to be integrally formed because the combination and optical element and microlens form a one-piece pre-aligned device once it has been fabricated.

The wafer optical element optical transmission ports 204 are separated from adjacent optical transmission ports by a first spacing. Likewise, the microlens array first lens surfaces 214 have a center axis that is separated from adjacent microlenses by the first spacing 216. The interface between each optical element and each lens is consistent, with each having the same alignment error for each particular die, making the process scalable for volume production.

FIGS. 3A and 3B are partial cross-sectional views depicting two different types of microlens arrays, in FIG. 3A the lens are preformed prior to assembly, and the array of preformed lens is adhered to the wafer top surface. In this case, each optical element assembly microlens 212 is a material such as glass, quartz, or silica. The adherent typically takes on the shape of the optical transmission port 204 and lens first surface 215, so that there is no air gap.

In FIG. 3B the microlens assembly is comprised of cavities in its bottom surface of a mold 300. For example, a quartz plate mold 300 with inverse lens imprints is created. Areas overlapping the VCSEL (electrical interface) pads are masked out to eliminate polymer hardening on pads. Alternatively, the pads can be masked on the wafer itself. The mold 300 is positioned over the wafer and aligned using fiducial marks on a wafer 200. Due to capillary action, which may be assisted by suction, UV curable polymer (e.g., from the ORMOCER® family) fills the cavities between the mold and the wafer. The polymer is UV illuminated, causing it to be hardened and retain the lens shape. Typically the mold is then removed and unhardened polymer is washed off to reveal pads for further wire bonding. The wafer is cut into individual VCSELs each containing a lens. A comparable process forms lenses over a wafer of photodiodes. Additional details of the fabrication process are provided below.

FIGS. 4A and 4B are, respectively, perspective and partial cross-sectional views of an integral lens/optical element assembly. Subsequent to dicing the wafer, a plurality of optical element assemblies 400 are formed, each optical element assembly 400 including an optical element 202 integrally formed with an attached microlens 212. Seen in FIG. 4A are electrical interface pads 402 and 404. Each microlens 212 has a second lens surface 408 overlying the microlens, with a third shape (shown here as convex).

As shown in FIG. 4B, the lens material may form a margin region boundary of inhomogenous or improperly cured lens material 406 if the lenses are formed in the manner described above in the explanation of FIG. 3B. However, this margin does not significantly affect light beam transmission. In one aspect, the margin 406 is about 50 microns wide. The combination of the homogenous central part of the lens and the inhomogenous margin may be referred to as a pedestal. Thus, each optical element assembly microlens 212 includes a polymer pedestal overlying the corresponding optical transmission port 204, forming the first lens surface 214. Further, each microlens 212 has a second lens surface 408 overlying the microlens pedestal, with a third shape (shown here as convex).

Figure 5:
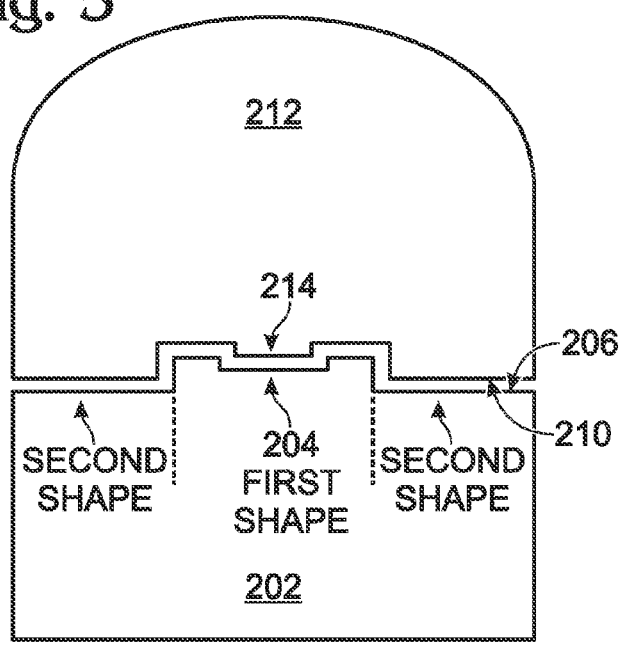
FIG. 5 is a partial cross-sectional view of an optical element assembly detailing the mechanical interface between the lens and optical element.

FIG. 5 is a partial cross-sectional view of an optical element assembly detailing the mechanical interface between the lens and optical element. Each optical element optical transmission port 204 has a top surface with a first shape. In one aspect, each microlens first lens surface 214 has an inverted first shape adhering to the corresponding optical transmission top surface first shape. In another aspect, each optical element has a top surface 206 with a second shape, surrounding the corresponding optical transmission port 204. In this aspect, each microlens has a region with an inverted second shape, surrounding the first lens surface 214, adhering to the corresponding optical element top surface second shape.

Figure 6:
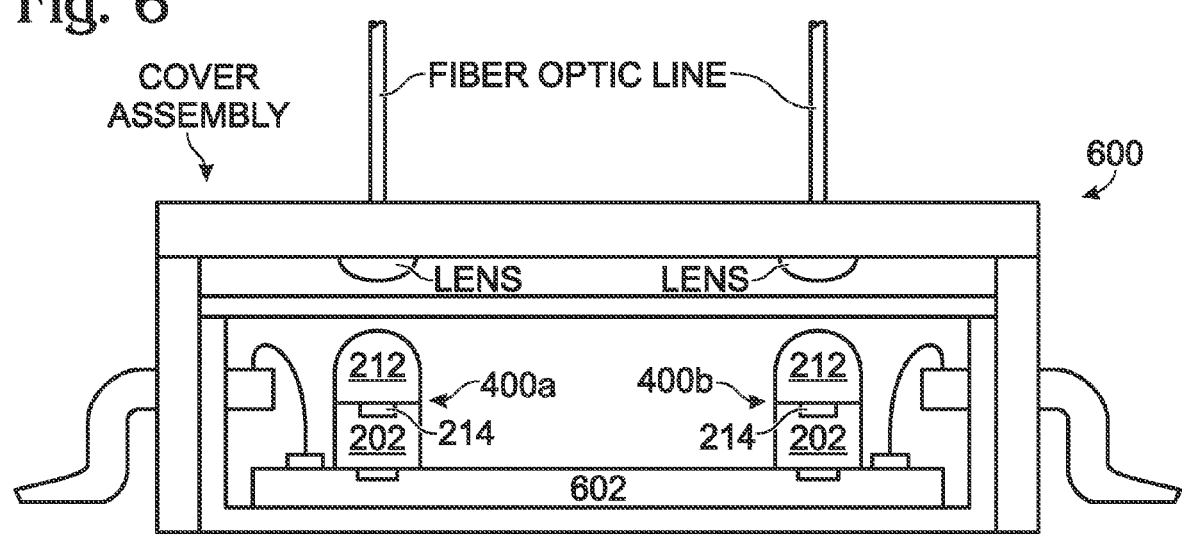
FIG. 6 is a partial cross-sectional view of an optical integrated circuit (IC).

FIG. 6 is a partial cross-sectional view of an optical integrated circuit (IC). The optical IC 600 comprises a substrate or printed circuit board (PCB) 602 having a top surface 604 with electrical contacts 606. An optical element assembly 400 is mounted on the substrate 602. The optical element assembly 400 comprises either a laser diode or photodiode 202 having an electrical interface connected to a substrate electrical contact 606, an optical interface 204, and a lens 212 integrally formed overlying the optical interface 204. This particular IC uses a cover assembly with lens and interfaces to engage a fiber optic line.

Figure 7:
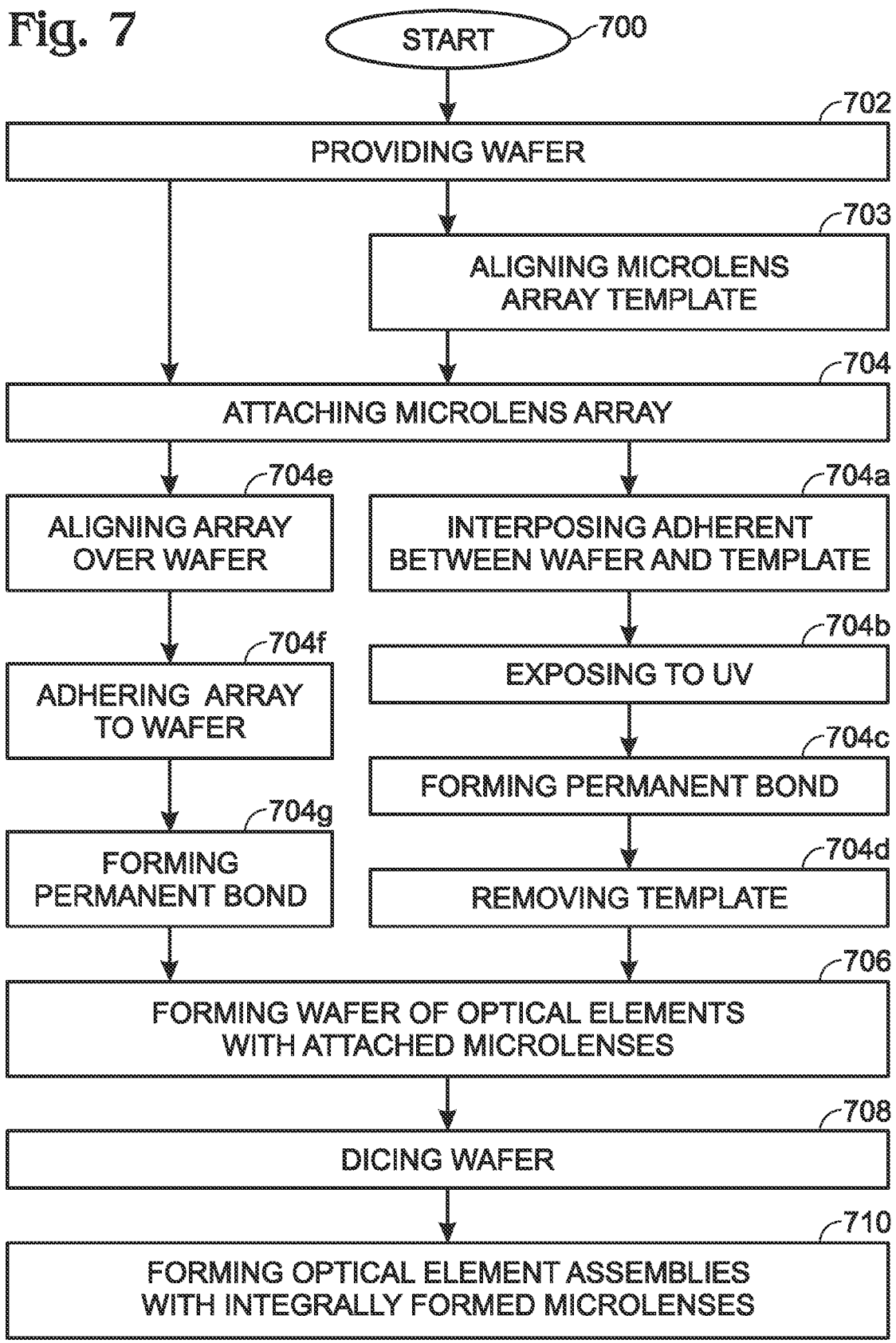
FIG. 7 is a flowchart illustrating a method for the fabrication of an optical element assembly with integrally formed microlens.

FIG. 7 is a flowchart illustrating a method for the fabrication of an optical element assembly with integrally formed microlens. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 700.

Step 702 provides a wafer with a plurality of adjacent IC optical elements. Each optical element has an optical transmission port in a wafer top surface. The optical element can be either a photodiode or a laser diode. Step 704 attaches a microlens array to the wafer top surface, so that each microlens in the array overlies a corresponding optical element optical transmission port. Step 706 forms a wafer of optical elements with attached microlenses, where each microlens has a first lens surface adhering directly to a corresponding optical transmission port. As explained above, each microlens has the first lens surface, a pedestal overlying the first lens surface having a first thickness, and a second lens surface overlying the pedestal with a third shape. In one aspect, each microlens has a first lens surface adhering directly to a corresponding optical transmission port without an air gap.

Subsequent to forming the wafer of optical elements with attached microlenses, Step 708 dices the wafer. Step 710 forms a plurality of optical element assemblies, where each optical element assembly includes an optical element integrally formed with an attached microlens.

in one aspect, Step 703 aligns a microlens array template over the wafer. Then, attaching the microlens array in Step 704 includes the following substeps. Step 704a interposes an adherent, such as liquid polymer, between the microlens array template and the wafer top surface. Step 704b exposes the adherent to an ultraviolet (UV) light source. In Step 704c the UV exposed adherent forms a permanent bond with the wafer top surface, and in Step 704d the microlens array template is removed.

Alternatively, attaching the microlens array to the wafer top surface in Step 704 includes the following substeps. Step 704e aligns the microlens array (e.g., of glass) over the wafer. Step 704f adheres the microlens array to the wafer top surface. For example, liquid polymer interposed between the array and the wafer may be used as the adhesive. Step 704g forms a permanent bond between to the microlenses array and the wafer top surface.

In one aspect, Step 702 provides a wafer with the optical element optical transmission ports separated from adjacent optical transmission ports by a first spacing. Then, Step 704 attaches the microlens array, where a center axis of each microlens is separated from adjacent microlenses by the first spacing.

In another aspect, Step 702 provides the wafer with each optical element optical transmission port having a top surface with a first shape. Then, forming the wafer of optical elements with attached microlenses in Step 706 includes each microlens first lens surface having an inverted first shape adhering to the corresponding optical transmission port first shape. Likewise, if Step 702 provides each optical element with a top surface having a second shape surrounding the optical transmission port, then Step 706 includes each microlens having a region with an inverted second shape surrounding the first lens surface, adhering to the corresponding optical element top surface second shape.

An optical element assembly with integrally formed microlens has been provided. Examples of particular materials and fabrication steps have been presented to illustrate the invention. However, the invention is not limited to merely these examples. Other variations and embodiments of the invention will occur to those skilled in the art.

We claim:

1. A method for the fabrication of an optical element assembly with integrally formed microlens, the method comprising:
   providing a wafer with a plurality of adjacent IC optical elements, each optical element having an optical transmission port in a wafer top surface;
   attaching a microlens array to the wafer top surface, so that each microlens in the array overlies a corresponding optical element optical transmission port; and,
   forming a wafer of optical elements with attached microlenses, where each microlens has a first lens surface adhering directly to a corresponding optical transmission port.

2. The method of claim 1 further comprising:
   subsequent to forming the wafer of optical elements with attached microlenses, dicing the wafer; and,
   forming a plurality of optical element assemblies, each optical element assembly including an optical element integrally formed with an attached microlens.

3. The method of claim 1 further comprising:
   aligning a microlens array template over the wafer;
   wherein attaching the microlens array includes:
      interposing an adherent between the microlens array template and the wafer top surface;
      exposing the adherent to an ultraviolet (UV) light source;
      the UV exposed adherent forming a permanent bond with the wafer top surface; and,
      removing the microlens array template.

4. The method of claim 3 wherein interposing the adherent includes interposing liquid polymer.

5. The method of claim 1 wherein attaching the microlens array to the wafer top surface includes:
   aligning the microlens array over the wafer;
   adhering the microlens array to the wafer top surface; and,
   forming a permanent bond between the microlenses array and the wafer top surface.

6. The method of claim 5 wherein adhering the microlens array to the wafer top surface includes interposing liquid polymer as an adhesive.

7. The method of claim 1 wherein providing the wafer includes providing the optical element optical transmission ports separated from adjacent optical transmission ports by a first spacing; and,
   wherein attaching the microlens array includes attaching the microlens array, where a center axis of each microlens is separated from adjacent microlenses by the first spacing.

8. The method of claim 1 wherein providing the wafer with the plurality of adjacent IC optical elements includes each optical element optical transmission port having a top surface with a first shape; and,
   wherein forming the wafer of optical elements with attached microlenses includes each microlens first lens surface having an inverted first shape adhering to the corresponding optical transmission port first shape.

9. The method of claim 8 wherein providing the wafer with the plurality of adjacent IC optical elements includes each optical element having a top surface with a second shape surrounding the optical transmission port; and,
   wherein forming the wafer of optical elements with attached microlenses includes each microlens having a region with an inverted second shape surrounding the first lens surface, adhering to the corresponding optical element top surface second shape.

10. The method of claim 9 wherein forming the wafer of optical elements with attached microlenses includes each microlens having the first lens surface, a pedestal overlying the first lens surface having a first thickness, and a second lens surface overlying the pedestal with a third shape.

11. The method of claim 1 wherein providing the wafer with the plurality of adjacent IC optical elements includes the optical elements being selected from a group consisting of laser sources and photodiodes.

12. The method of claim 1 wherein forming the wafer of optical elements with attached microlenses includes adhering each microlens first lens surface directly to a corresponding optical transmission port without an air gap.

13. An optical element with integrally formed microlens, the optical element comprising:
a wafer with a plurality of adjacent IC optical elements, each optical element having an optical transmission port in a wafer top surface; and,
a microlens array with a bottom surface overlying the wafer top surface, where each microlens overlies a corresponding optical element optical transmission port, with a first lens surface adhering directly to a corresponding optical transmission port.

14. The optical element of claim 13 further comprising:
subsequent to dicing the wafer, a plurality of optical element assemblies, each optical element assembly including an optical element integrally formed with an attached microlens.

15. The optical element of claim 14 wherein each optical element assembly microlens includes a polymer pedestal overlying the corresponding optical transmission port, forming the first lens surface.

16. The optical element of claim 15 wherein each microlens has a second lens surface overlying the microlens, with a third shape.

17. The optical element of claim 13 wherein the wafer optical element optical transmission ports are separated from adjacent optical transmission ports by a first spacing; and,
wherein the microlens array first lens surfaces have a center axis that is separated from adjacent microlenses by the first spacing.

18. The optical element of claim 14 wherein each optical element optical transmission port has a top surface with a first shape; and,
wherein each microlens first lens surface has an inverted first shape adhering to the corresponding optical transmission top surface first shape.

19. The optical element of claim 18 wherein each optical element has a top surface with a second shape surrounding the corresponding optical transmission port; and,
wherein each microlens has a region with an inverted second shape surrounding the first lens surface, adhering to the corresponding optical element top surface second shape.

20. The optical element of claim 14 wherein the optical element is selected from a group consisting of a laser source and photodiode.

21. The optical element of claim 14 wherein each optical element assembly microlens is a material selected from a group consisting of glass, quartz, and silica.

22. The optical element of claim 21 wherein each microlens has a second lens surface overlying the microlens, with a third shape.

23. The optical element of claim 13 wherein each microlens overlies a corresponding optical element optical transmission port, with the first lens surface adhering directly to a corresponding optical transmission port without an air gap.

* * * * *